(12) United States Patent
Fukano et al.

(10) Patent No.: US 8,960,749 B2
(45) Date of Patent: Feb. 24, 2015

(54) VACUUM SUCTION APPARATUS

(75) Inventors: Yoshihiro Fukano, Moriya (JP); Shuzo Sakurai, Funabashi (JP); Masahiko Someya, Ryugasaki (JP)

(73) Assignee: SMC Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/607,983

(22) Filed: Sep. 10, 2012

(65) Prior Publication Data

US 2013/0082475 A1  Apr. 4, 2013

(30) Foreign Application Priority Data

Oct. 3, 2011 (JP) ................................ 2011-218831

(51) Int. Cl.
B25J 15/06 (2006.01)
B65G 47/91 (2006.01)
H01L 21/683 (2006.01)
B25B 11/00 (2006.01)

(52) U.S. Cl.
CPC ............ B65G 47/91 (2013.01); H01L 21/6838 (2013.01); B25B 11/007 (2013.01); Y10S 901/40 (2013.01)
USPC ............................... 294/188; 294/189; 901/40

(58) Field of Classification Search
USPC ......... 294/183, 188, 189, 184, 185, 186, 187, 294/64.2, 64.3, 65, 902, 213; 901/40; 414/737, 627, 941
See application file for complete search history.

(56) References Cited

U.S. PATENT DOCUMENTS 4,049,484 A * 9/1977 Priest et al. .................... 156/285
4,389,064 A * 6/1983 Laverriere .................... 294/188
5,013,075 A * 5/1991 Littell ........................... 294/189
2003/0164620 A1* 9/2003 Schmalz et al. ............. 294/64.1
2004/0113444 A1* 6/2004 Blonigan et al. .............. 294/1.1
2007/0200377 A1* 8/2007 Nishio ......................... 294/64.1

(Continued)

FOREIGN PATENT DOCUMENTS

JP  60-187144 U  12/1985
JP  06-126676 A   5/1994

(Continued)

OTHER PUBLICATIONS

Office Action issued Nov. 19, 2013 in Japanese Patent Application No. 2011-218831 (with English translation of pertinent portion).

(Continued)

*Primary Examiner* — Saul Rodriguez
*Assistant Examiner* — Gabriela Puig
(74) *Attorney, Agent, or Firm* — Oblon, Spivak, McClelland, Maier & Neustadt, L.L.P.

(57) ABSTRACT

A vacuum suction apparatus is equipped with a body having a supply port, and a pad provided on a lower portion of the body to which a workpiece can be attracted under suction. The pad is constituted from a base plate accommodated in a space of the body, a flexible intermediate plate provided on a lower portion of the base plate, and a suction sheet body disposed on a lower portion of the intermediate plate and having a sheet that attracts the workpiece under suction. In addition, the base plate, the intermediate plate and the suction sheet body are stacked along an axial direction of the body. The rigidity of the base plate is highest, whereas the rigidities of the intermediate plate and the suction sheet body are lower in this order, and the flexibilities thereof are greater in this order from the base plate.

7 Claims, 4 Drawing Sheets

(56) References Cited

U.S. PATENT DOCUMENTS

2010/0314894 A1* 12/2010 Watanabe et al. ............ 294/64.1
2011/0278870 A1* 11/2011 Omiya et al. ................. 294/188

FOREIGN PATENT DOCUMENTS

| JP | 2001-239488 A | 9/2001 |
| JP | 2002-144270 A | 5/2002 |
| JP | 2004-142056 A | 5/2004 |
| JP | 2004-298970 | 10/2004 |
| JP | 2005-228829 | 8/2005 |
| JP | 2006-175543 | 7/2006 |
| JP | 2008-251653 | 10/2008 |
| JP | 2009-117552 | 5/2009 |
| JP | 2010-155331 | 7/2010 |
| JP | 3164417 U | 11/2010 |

OTHER PUBLICATIONS

Office Action issued Mar. 18, 2014 in Japanese Patent Application No. 2011-218831 (with English translation of pertinent portion).

* cited by examiner

VACUUM SUCTION APPARATUS

CROSS-REFERENCE TO RELATED APPLICATION

This application is based upon and claims the benefit of priority from Japanese Patent Application No. 2011-218831 filed on Oct. 3, 2011, of which the contents are incorporated herein by reference.

BACKGROUND OF THE INVENTION

1. Field of the Invention

The present invention relates to a vacuum suction apparatus, which is capable of attracting a workpiece under a sucking action of a negative pressure fluid.

2. Description of the Related Art

In recent years, vacuum suction apparatus have been used for transporting sheet or panel shaped workpieces (for example, liquid crystal displays, solar energy cells). Such a vacuum suction apparatus, for example as disclosed in Japanese Laid-Open Patent Publication No. 2004-298970, is equipped with a main body to which a negative pressure or vacuum is supplied to the interior thereof, and a porous body, which is installed via a supporting body to an opening of the main body. A negative pressure fluid, which is supplied to the main body, acts through an intake passage of the supporting body and then through the porous body, whereby a workpiece is attracted under suction to a suction surface of the porous body.

SUMMARY OF THE INVENTION

Although in recent years the above-described vacuum suction apparatus have been used with the aim of transporting thin plate shaped workpieces such a solar panels, liquid crystal displays and the like, when such workpieces come into abutment against the suction surface of the porous body, chemical substances from the suction surface are transferred to and remain as suction tracks (adsorption traces) on the workpieces. Such suction tracks tend to lower the product quality of the workpieces. Further, for example, in the event that the workpiece is hard or rigid, deformation and damage to the workpiece may occur due to the suction force produced by the vacuum suction apparatus.

A general object of the present invention is to provide a vacuum suction apparatus, which can reliably prevent deformation of workpieces attracted under suction, while also preventing suction tracks from remaining on the workpieces, and which is capable of suppressing consumption of a negative pressure fluid.

The present invention is a vacuum suction apparatus for attracting a workpiece under a sucking action of a negative pressure fluid, comprising:

a body having a port to which the negative pressure fluid is supplied;

a suction part disposed on a lower portion of the body, and which is equipped with a flexible suction surface capable of being deformed in a manner conforming to the shape of a surface of the workpiece; and a sealing body disposed on a circumferential edge of the suction part for maintaining an airtight condition between the suction part and the body, wherein the suction surface is formed from a material that does not transfer chemical substances with respect to the workpiece when the workpiece is attracted thereto.

According to the present invention, in the vacuum suction apparatus, by providing the suction part on the lower portion of the body having a flexible suction surface capable of being deformed in a manner conforming to the shape of a surface of the workpiece, and by forming the suction surface from a material that does not transfer chemical substances with respect to the workpiece, when the workpiece is attracted thereto, suction tracks of the suction surface are prevented from adhering to and remaining on the surface of the workpiece. As a result, deterioration in workpiece quality can suitably be avoided. In addition, for example, in the event that a workpiece having an irregular shaped surface is attracted by the vacuum suction apparatus, since the flexible suction surface can deform following the workpiece surface and become adhered thereto, irrespective of the surface shape of the workpiece, the workpiece can be attracted reliably under suction by the suction part. Thus, deformations etc. of the workpiece can be avoided reliably and the workpiece can be attracted under suction. Further, by the suction surface of the suction part closely adhering with respect to the surface of the workpiece, the negative pressure that exists between the suction surface and the workpiece surface is prevented from leaking (or air or the like is prevented from being drawn between the suction surface and the workpiece surface), and consumption of the negative pressure fluid can be suppressed.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
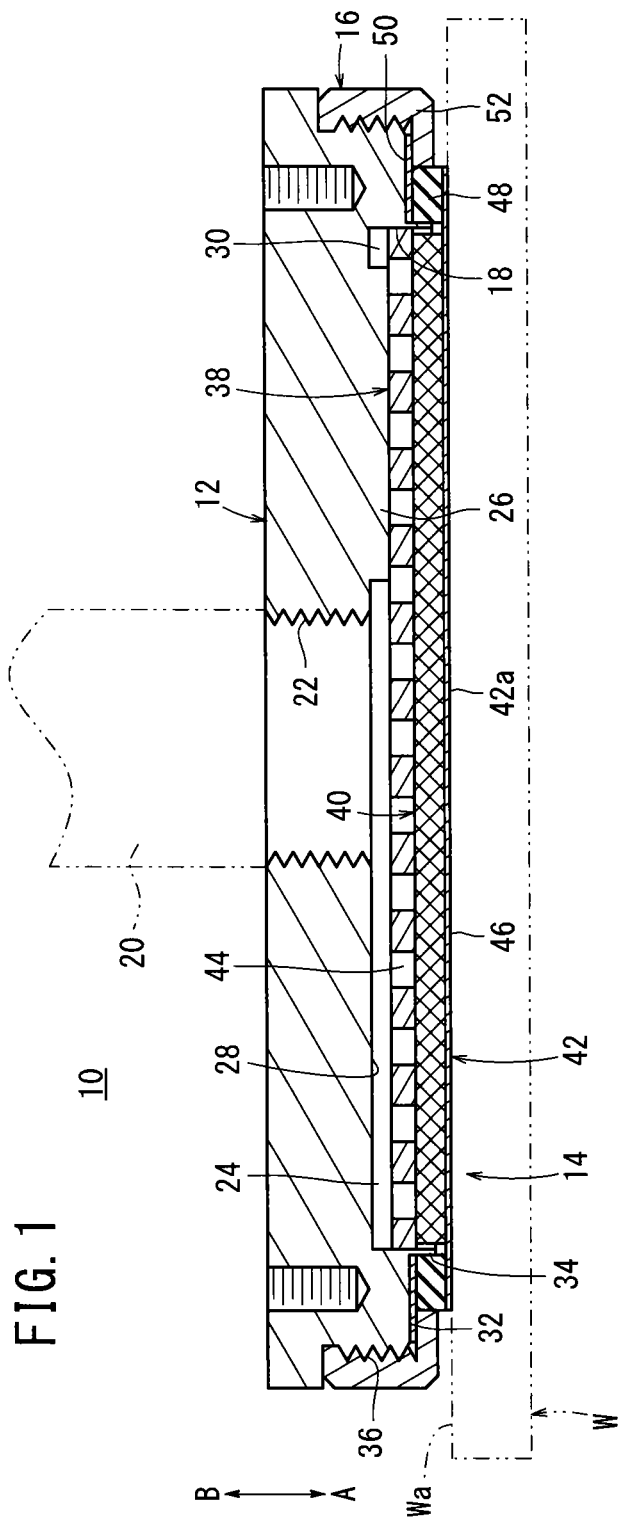
FIG. 1 is an overall cross sectional view of a vacuum suction apparatus according to an embodiment of the present invention.
Figure 2:
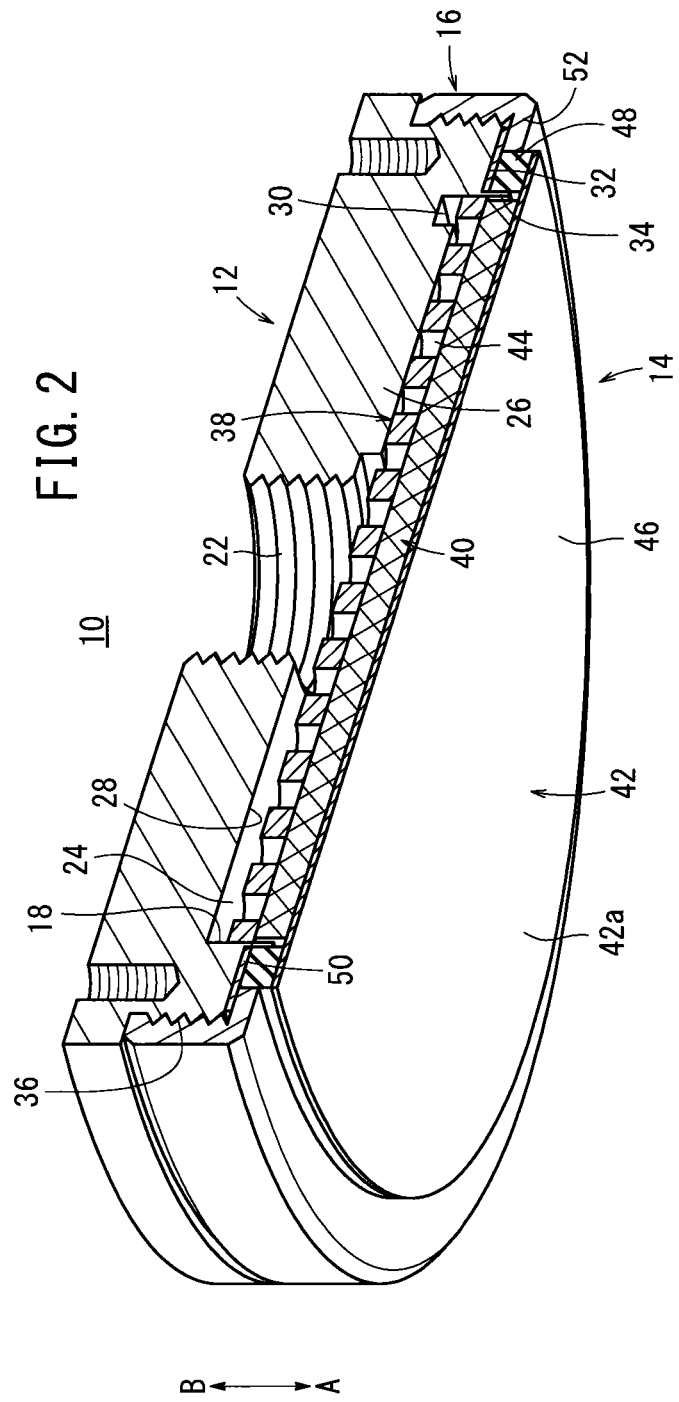
FIG. 2 is a perspective view partially in cross section of the vacuum suction apparatus shown in FIG. 1.
Figure 3:
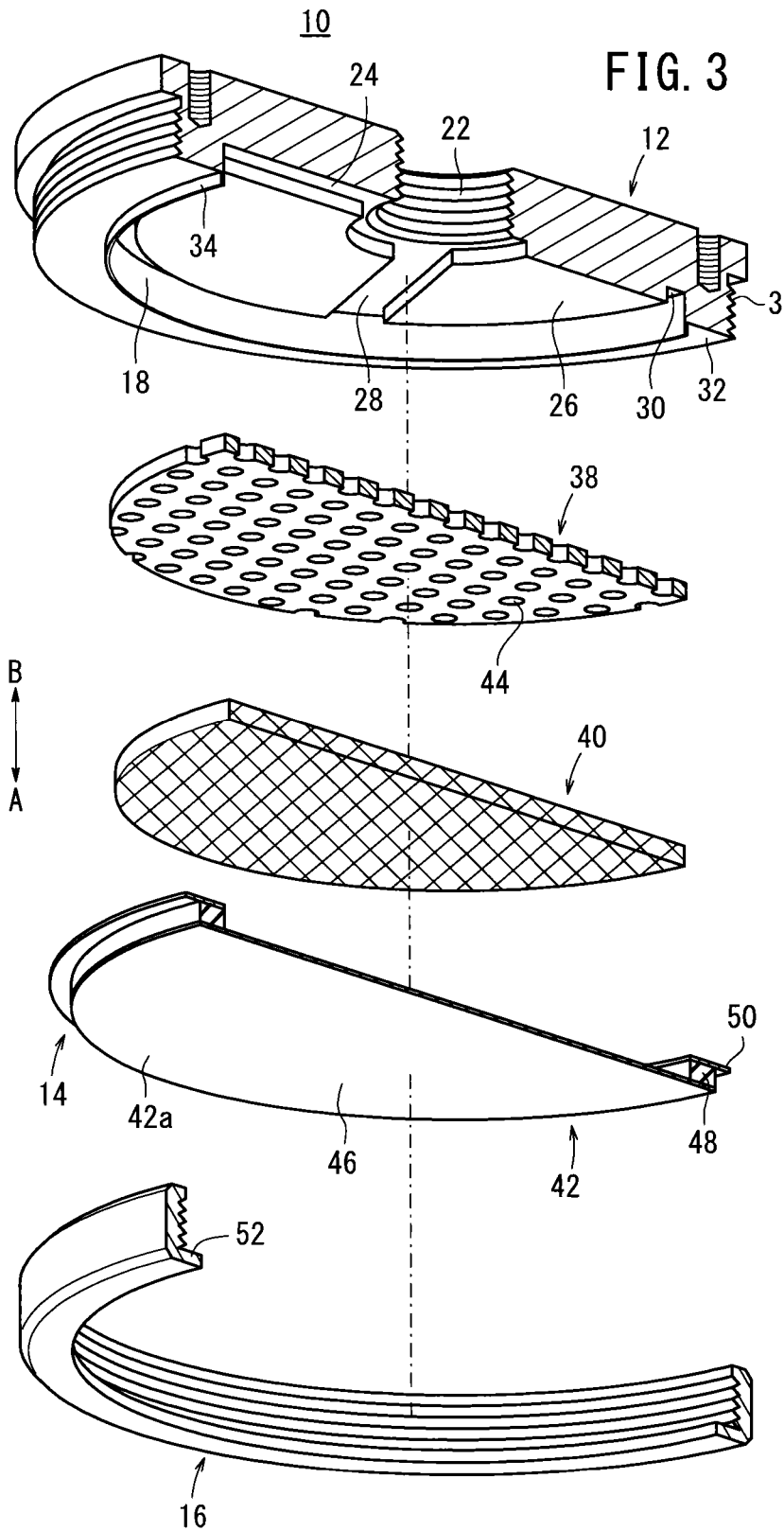
FIG. 3 is an exploded perspective view of the vacuum suction apparatus shown in FIG. 2.

In FIG. 1, reference numeral 10 indicates a vacuum suction apparatus according to an embodiment of the present invention. As shown in FIGS. 1 through 3, the vacuum suction apparatus 10 includes a body 12 connected to a non-illustrated vacuum generating apparatus, a pad (suction part) 14 disposed on a lower portion of the body 12 and which is capable of attracting a workpiece W under suction, and a ring body (retaining member) 16 that fixes the pad 14 with respect to the body 12. The vacuum suction apparatus 10 is mounted on a distal end of a transport arm or the like of a non-illustrated robot, and through the transport arm, is capable of being moved to a position where the workpiece W is disposed, or to a predetermined position where the workpiece W is to be transported.

The body 12, for example, is formed in a disk shape from a resin material, and is formed with an opening 18 therein, which opens toward one end surface on the side of the workpiece W (in the direction of the arrow A). Substantially in the center of the other end surface on the body 12, a supply port 22 is formed, which is connected to a tube 20 through a non-illustrated coupling. The tube 20 is connected with respect to the non-illustrated vacuum generating apparatus for thereby supplying a negative pressure fluid with respect to the supply port 22.

A space 24 is included in the interior of the body 12, which is recessed to a predetermined depth from the opening 18 toward the other end surface side (i.e., in the direction of the arrow B). A protrusion 26, which bulges in a substantially circular shape from the inner wall surface thereof, is formed roughly in the center of the space 24. The supply port 22 penetrates through the center of the protrusion 26, and a communication passage 28 is formed in the protrusion 26, which extends in a radial outward direction from the supply port 22. In addition, the communication passage 28 communicates with a ring-shaped annular passage 30 that is formed on the outer circumferential side of the protrusion 26. Since the communication passage 28 and the annular passage 30 are formed on the inner wall surface of the space 24, they are formed substantially in the same plane. More specifically, the negative pressure fluid acts from the supply port 22 to the space 24 of the body 12 through the communication passage 28 to create a negative pressure in the annular passage 30.

A seal mounting portion 32 is formed on the one end surface of the body 12 at a position on the outer circumferential side of the opening 18. The seal mounting portion 32 is formed in a planar shape, and an annular wall 34 is formed between the seal mounting portion 32 and the opening 18, which projects in the axial direction (in the direction of the arrow A) of the body 12.

Further, on the outer circumferential surface of the body 12, the vicinity of the one end surface having the opening 18 is reduced in diameter in a radial inward direction, and a threaded portion 36 having screw threads engraved thereon is formed along the circumferential direction. A ring body 16 (described later) is screw-engaged with the threaded portion 36.

The pad 14 includes a base plate (base body) 38 that abuts against the protrusion 26 and is accommodated in the space 24 of the body 12, an intermediate plate (intermediate body) 40 that abuts against a lower surface of the base plate 38, and a suction sheet body 42 that is disposed to cover the intermediate plate 40. The base plate 38, the intermediate plate 40, and the suction sheet body 42 are stacked along the axial direction (the direction of arrows A and B) of the body 12 concentrically.

The base plate 38 is constituted from a sintered porous body formed by sintering a resin material, for example, and having a plurality of through holes 44 that penetrate through the interior thereof. The through holes 44 penetrate in the thickness direction (the direction of arrows A and B) of the base plate 38, and are separated mutually by substantially equal distances from each other. Moreover, the base plate 38 is not limited to being formed from a sintered porous resin, but may be formed of a non-woven fabric or sponge having a predetermined rigidity by press-forming or through selection of materials. Alternatively, the base plate 38 may be formed using a plate made up from a metal or resin material having grooves or holes formed therein through which a fluid can flow.

Further, the base plate 38 is formed in a disk shape having a roughly constant thickness, and the rigidity of the base plate 38 is set to be higher than that of the later-described intermediate plate 40. The outer diameter of the base plate 38 is set to be roughly the same as, or slightly smaller than, the inner diameter of the space 24 in the body 12.

The intermediate plate 40 is formed with a predetermined thickness from an air permeable and elastic material such as sponge or the like, for example, so that fluid is able to pass through the interior thereof. Similar to the base plate 38, the intermediate plate 40 is formed in a disk shape, with the outer diameter thereof being set roughly the same as that of the base plate 38.

In addition, the negative pressure fluid acts through the base plate 38 to create a negative pressure in the interior of the intermediate plate 40 and further on the side of the suction sheet body 42. Instead of sponge, the intermediate plate 40 may be made of rubber, polymer gel, non-woven fabric, or the like. More specifically, the intermediate plate 40 is formed by its construction or by the materials used therefor to be lower in rigidity, and greater in flexibility in comparison with the base plate 38. Further, holes or pores may be added to the intermediate plate 40 for increasing the air permeability of the intermediate plate 40.

The suction sheet body 42 is made up, for example, from an air permeable sheet (suction sheet) 46, and a seal ring (sealing member) 48, which is disposed around the outer circumferential surface of the sheet 46. The sheet 46 is formed from a flexible and air permeable material in the form of a thin plate by a fabric or textile, for example, made from films or synthetic fibers. Further, a material (e.g., a synthetic fiber fabric, a non-woven fabric, a thermoplastic resin), which does not transfer chemical substances with respect to the workpiece W, is used on the material of the sheet 46.

The sheet 46, for example, includes a plurality of pores (not shown) which are interwoven therein in a lattice shape. The arrangement of the pores, the quantity and size thereof are set appropriately in accordance with the shape, etc., of the workpiece W that is to be attracted under suction.

The seal ring 48 is formed with a rectangular shape in cross section, for example, from a flexible material such as rubber, sponge, or the like, which is formed to be impermeable so that fluid cannot pass through the interior thereof. In addition, a lower surface of the seal ring 48 is bonded by an adhesive to the outer edge of the sheet 46. Further, an annular retaining plate 50 is mounted on the upper surface of the seal ring 48, and is disposed thereon to project in a radial outward direction with respect to the outer circumferential surface of the seal ring 48.

In addition, the upper surface of the seal ring 48 is disposed in abutment with the seal mounting portion 32 of the body 12 through the retaining plate 50. As described later, the outer edge of the retaining plate 50 is held by the ring body 16. Owing thereto, the suction sheet body 42 together with the seal ring 48 are retained with respect to the body 12.

The ring body 16 is substantially L-shaped in cross section and is screw-engaged with the threaded portion 36 of the body 12 through threads engraved on the inner circumferential surface thereof along the axial direction (the direction of arrows A and B). In addition, an annular pressing member 52 that projects radially inward on the ring body 16 serves to hold the retaining plate 50 of the suction sheet body 42, whereby the retaining plate 50 is gripped between the ring body 16 and the seal mounting portion 32 of the body 12. As a result, the base plate 38 and the intermediate plate 40 are retained through the suction sheet body 42 in a condition of being accommodated inside the space 24 of the body 12. Further, in this case, the lower portion of the suction sheet body 42 is arranged to project downwardly with respect to the ring body 16.

As described above, the pad 14 is of a stacked structure which is stacked along the axial direction (the direction of arrows A and B) of the body 12. The base plate 38 thereof is highest in rigidity, whereas the sheet 46 of the suction sheet body 42 is lowest in rigidity and highest in flexibility, and the rigidity of the intermediate plate 40 is set between that of the base plate 38 and the sheet 46. More specifically, the sheet 46 of the suction sheet body 42 is formed to be flexible with maximum elasticity, whereas the base plate 38 is formed to be rigid and without elasticity, and the intermediate plate 40 is formed to have a predetermined elasticity and rigidity, which are set to intermediate values between those of the base plate 38 and the suction sheet body 42.

The vacuum suction apparatus 10 according to the embodiment of the present invention is basically constructed as described above. Next, operations and advantageous effects of the vacuum suction apparatus 10 will be explained. The vacuum suction apparatus 10 is, for example, placed in a state of being connected beforehand to the transport arm of a non-illustrated robot or the like, and in which a suction surface 42a of the suction sheet body 42 faces downwardly, and further, wherein the tube 20, which is connected to the supply port of the body 12, is connected to a non-illustrated negative pressure fluid (vacuum) supply source.

After the above preparatory operations have been completed, first, the vacuum suction apparatus 10 is moved via the transport arm of the non-illustrated robot, and the pad 14 is brought into abutment against a surface Wa (upper surface) of the workpiece W. Additionally, the negative pressure fluid, which is introduced to the communication passage 28 and the annular passage 30 through the supply port 22 of the body 12, acts through the through holes 44 of the base plate 38, and then further acts on the side of the intermediate plate 40. Through the intermediate plate 40, the negative pressure fluid acts to create a negative pressure on the side of the workpiece W through the sheet 46 of the suction sheet body 42. At this time, due to the seal ring 48 provided on the suction sheet body 42, the negative pressure acts only in a downward direction toward the side of the workpiece W, without leaking in an outer circumferential direction from the space 24 of the body 12 (or without drawing outside air or the like from the outer circumferential side of the body 12 into the space 24).

Further, as shown in FIG. 1, the workpiece W is attracted under suction to the pad 14 by the negative pressure fluid, which acts from the suction surface 42a of the suction sheet body 42 on the pad 14.

Finally, in a condition in which the workpiece W is attracted under suction to the pad 14, the vacuum suction apparatus 10 is moved to a desired transport position by the transport arm, and after the workpiece W is placed in the transport position, the supply of negative pressure fluid is stopped. Consequently, the workpiece W is released from the state of attraction with respect to the pad 14, and the workpiece W is placed or disposed in the transport position.

Figure 4:
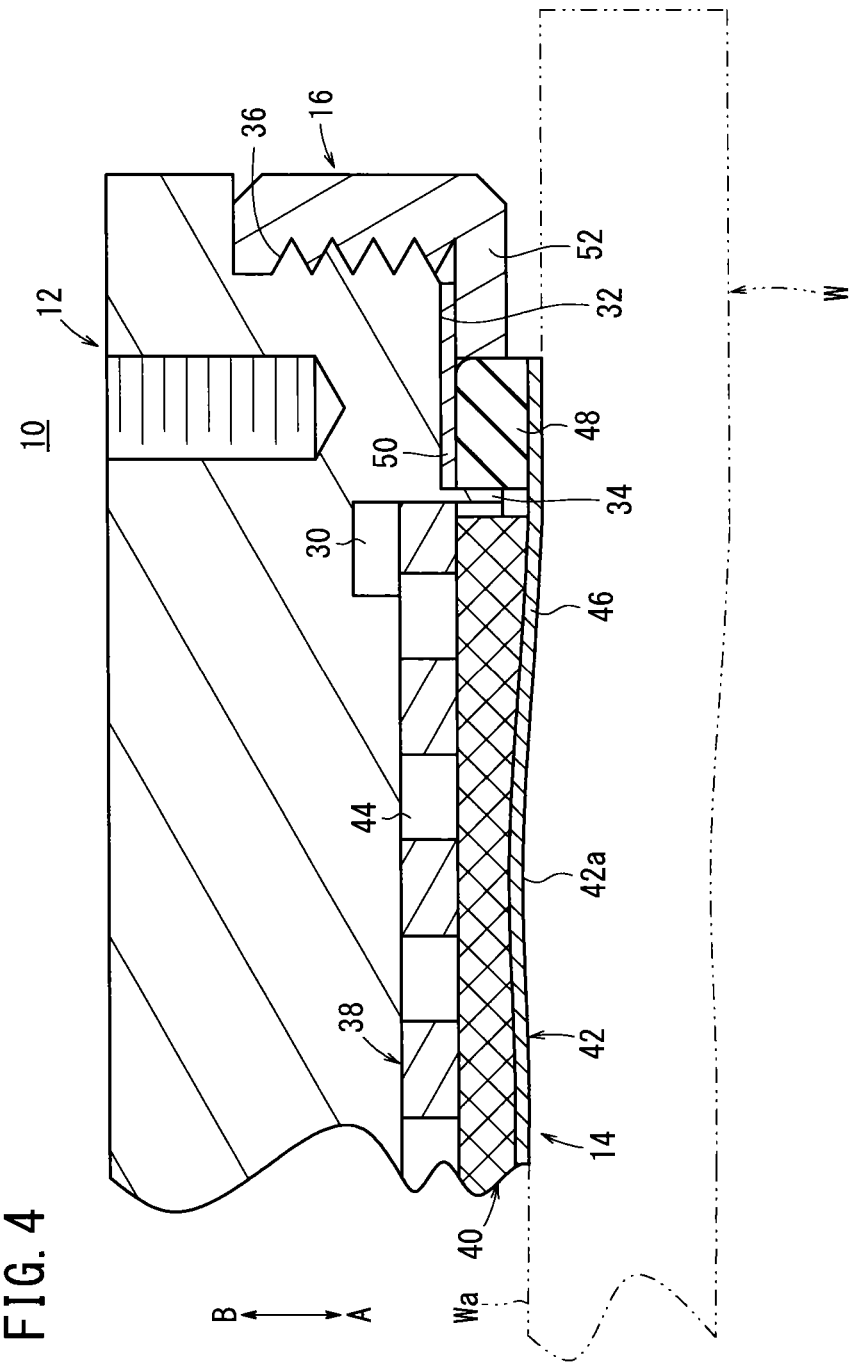
FIG. 4 is an enlarged cross sectional view showing a condition in which a workpiece having an irregular shaped surface is attracted under suction to the vacuum suction apparatus.

On the other hand, in the case that the workpiece W is not flat in cross section as shown in FIG. 1, but rather, the surface Wa is of an irregular curved shape in cross section as shown in FIG. 4, by abutment of the suction sheet body 42 of the vacuum suction apparatus 10 against the workpiece W, the flexible sheet 46 bends to conform to the surface Wa of the workpiece W, and the seal ring 48 is deformed as well so as to follow the cross sectional shape of the workpiece W.

Furthermore, because the intermediate plate 40 that abuts with the suction sheet body 42 is flexible, the intermediate plate 40 also becomes deformed in a corresponding manner with the deformation of the suction sheet body 42. Moreover, because the base plate 38 has a large rigidity in relation to that of the intermediate plate 40, the base plate 38 does not become deformed, but acts to reliably and firmly retain the intermediate plate 40.

In addition, by supply of the negative pressure fluid to the body 12, the negative pressure fluid acts through the base plate 38, the intermediate plate 40, and the suction sheet body 42, and the workpiece W is attracted under suction to the suction surface 42a of the sheet 46.

In this manner, for example, even in the case that a rigid workpiece W with a curved shape in cross section is attracted under suction, because the suction sheet body 42 and the intermediate plate 40 that constitute the pad 14 can bend in a corresponding relation to the surface Wa of the workpiece W, the suction surface 42a of the pad 14 can suitably come into contact with the workpiece W and attract the workpiece W. As a result, when the aforementioned workpiece W is attracted under suction by the pad 14, the workpiece W can reliably and stably be transported without causing deformation or damage thereto.

Further, because the aforementioned intermediate plate 40 is only subjected to elastic deformation and is not plastically deformed, after separating away from the workpiece W, owing to the elasticity thereof, the intermediate plate 40 can be restored to its initial shape.

In the foregoing manner, according to the present embodiment, a structure is provided in which, in the pad 14 that attracts the workpiece W, the suction sheet body 42, the base plate 38, and the intermediate plate 40, each having different rigidities and elasticities, are stacked, and the sheet 46 of the suction sheet body 42, which abuts against the workpiece W, is flexible and lowest in rigidity. Therefore, for example, even in the case that a workpiece W, which has a surface Wa irregularly shaped in cross section, is attracted under suction, the sheet 46 is capable of bending in a manner conforming to the shape of the surface Wa and coming into close contact therewith.

As a result, regardless of the surface shape of the workpiece W, the pad 14 can be brought into close contact with and attract the workpiece W under suction. Stated otherwise, the suction force of the pad 14 is not applied locally with respect to the surface Wa of the workpiece W, but is applied equally and uniformly over the entire surface Wa. Therefore, deformation and damage to the workpiece W can suitably be avoided.

Further, since the sheet 46 of the suction sheet body 42 that comes into abutment against the workpiece W is formed from a material that does not transfer chemical substances with respect to the workpiece W, suction tracks can be prevented from being left behind on the surface Wa when the workpiece W is attracted under suction. As a result, deterioration in the quality of the workpiece W can suitably be avoided.

Furthermore, in the case of attracting a workpiece W having a surface Wa that is irregularly shaped in cross section, since the intermediate plate 40 is deformed integrally accompanying deformation of the sheet 46 in the suction sheet body 42, while the sheet 46 remains held, the sheet 46 can be made to conform to the surface shape of the workpiece W.

Still further, by the suction surface 42a of the pad 14 being placed in close contact with the surface Wa of the workpiece W, leakage of negative pressure fluid passing between the suction surface 42a and the surface Wa can be prevented (or drawing of air or the like between the suction surface 42a and the surface Wa can be prevented), and therefore, undue consumption of negative pressure fluid can be suppressed.

Still further, the base plate 38, the intermediate plate 40, and the suction sheet body 42 that constitute the pad 14 are stacked with respect to the body 12, and can easily be separated and detached therefrom simply by removal of the ring body 16. Thus, even in the case of clogging or wear of the base plate 38, the intermediate plate 40, and the suction sheet body 42, which may occur over prolonged use, the components can be removed for enabling maintenance operations to be carried out thereon. As a result, maintainability of the vacuum suction apparatus 10 can be improved. In this case, any one of the base plate 38, the intermediate plate 40, and the suction sheet body 42 may be replaced, or the entire pad 14 may be replaced as a unit.

Further, as a result of the retaining plate 50, which is disposed on the upper portion of the suction sheet body 42 and projects radially outward therefrom, being retained by the ring body 16, which is screw-engaged with the outer circumferential side of the body 12, the suction sheet body 42 is easily and reliably retained on the lower portion of the body 12, while at the same time, the base plate 38 and the intermediate plate 40 are retained in the interior of the space 24 of the body 12 by the suction sheet body 42. More specifically, by a simple operation of screw-engaging the ring body 16 with respect to the body 12, the pad 14 made up from the suction sheet body 42, the base plate 38, and the intermediate plate 40 can be fixed reliably with respect to the body 12. Stated otherwise, compared to the case of fixing the pad 14 with respect to the body 12 using bolts or the like, the assembly operation of the pad 14 can be simplified, and since bolts are unnecessary, the number of parts can be reduced.

Furthermore, because the base plate 38 is never in direct contact with the workpiece W, the materials of the base plate 38 can freely be selected without consideration or concern over the occurrence of suction tracks appearing on the workpiece W.

Still further, because the lower surface side (in the direction of the arrow A) of the seal ring 48, which is made from a flexible material such as rubber or the like, is covered by the sheet 46, when the workpiece W is attracted under suction, the seal ring 48 itself does not contact the workpiece W, and thus suction tracks, which could be caused by rubber or the like coming into contact with the workpiece W, can be prevented from occurring. Stated otherwise, the materials of the seal ring 48 can freely be selected and set without consideration or concern over the occurrence of suction tracks appearing on the workpiece W.

Still further, by appropriately selecting and setting the material and cross sectional shape of the seal ring 48, the ability of the seal ring 48 to conform or track with the shape of the workpiece W when the pad 14 is brought into close contact with respect to the workpiece W can be varied.

The vacuum suction apparatus according to the present invention is not limited to the above embodiment, and it is a matter of course that various additional or modified structures could be adopted without departing from the essence and gist of the invention as set forth in the appended claims.

What is claimed is:

1. A vacuum suction apparatus for attracting a workpiece under a sucking action of a negative pressure fluid, comprising:
   a body having a port to which the negative pressure fluid is supplied;
   a suction part disposed on a lower portion of the body, and which is equipped with a flexible suction surface capable of being deformed in a manner conforming to the shape of a surface of the workpiece; and
   a sealing body disposed on a circumferential edge of the suction part for maintaining airtightness between the suction part and the body,
   wherein the suction surface is formed from a material that does not transfer chemical substances with respect to the workpiece when the workpiece is attracted thereto,
   wherein the suction part comprises:
   a base body disposed on a side of the port in the body and which is capable of allowing the negative pressure fluid to act therethrough to create a negative pressure on a side of the workpiece;
   a flexible suction sheet disposed on a lower portion of the body that attracts the workpiece under suction; and
   a flexible intermediate body disposed between the suction sheet and the base body and through which the negative pressure fluid can pass, and which is deformable together with the suction sheet,
   wherein the base body, the intermediate body and the suction sheet are stacked along a thickness direction, the rigidities of the base body, the intermediate body, and the suction sheet are set to become progressively lower in this order, and the flexibilities thereof are set to become progressively greater in this order, and
   wherein the material constituting the suction sheet is a thermoplastic resin.

2. The vacuum suction apparatus according to claim 1, wherein the sealing body comprises a sealing member made up from an impermeable elastic material.

3. The vacuum suction apparatus according to claim 1, wherein a retaining member that retains the suction sheet with respect to the body is screw-engaged detachably on an outer circumferential portion of the body.

4. The vacuum suction apparatus according to claim 3, wherein the retaining member includes a pressing member formed in an annular shape and which projects in a radial inward direction, the pressing member retaining a lower surface of the suction sheet.

5. The vacuum suction apparatus according to claim 1, wherein the base body is formed from a sintered porous body having a plurality of through holes that penetrate through the interior thereof.

6. The vacuum suction apparatus according to claim 1, wherein the material constituting the suction surface is a thermoplastic resin that does not transfer chemical substances with respect to the workpiece when the workpiece is attracted thereto.

7. The vacuum suction apparatus according to claim 1, wherein the material constituting the suction surface is a fabric that does not transfer chemical substances with respect to the workpiece when the workpiece is attracted thereto.

* * * * *